(12) United States Patent
Lan et al.

(10) Patent No.: US 11,791,226 B2
(45) Date of Patent: Oct. 17, 2023

(54) DEVICE ON CERAMIC SUBSTRATE

(71) Applicant: QUALCOMM Incorporated, San Diego, CA (US)

(72) Inventors: Je-Hsiung Lan, San Diego, CA (US); Ranadeep Dutta, Del Mar, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 138 days.

(21) Appl. No.: 17/017,407

(22) Filed: Sep. 10, 2020

(65) Prior Publication Data

US 2021/0098319 A1 Apr. 1, 2021

Related U.S. Application Data

(60) Provisional application No. 62/906,535, filed on Sep. 26, 2019.

(51) Int. Cl.
 *H01L 23/15* (2006.01)
 *H01L 21/768* (2006.01)
 *H01L 21/321* (2006.01)
 *H01L 21/48* (2006.01)
 *H01L 23/522* (2006.01)
(Continued)

(52) U.S. Cl.
CPC ............ *H01L 23/15* (2013.01); *C04B 35/111* (2013.01); *C04B 37/025* (2013.01); *H01L 21/3212* (2013.01); *H01L 21/4807* (2013.01); *H01L 21/76801* (2013.01); *H01L 23/3738* (2013.01); *H01L 23/5222* (2013.01); *H01L 27/0629* (2013.01); *H03H 3/10* (2013.01);
(Continued)

(58) Field of Classification Search
None
See application file for complete search history.

(56) References Cited

U.S. PATENT DOCUMENTS 3,726,002 A * 4/1973 Greenstein .......... H01L 23/5383
 257/E23.005
2010/0248445 A1* 9/2010 Takayama ......... H01L 21/76254
 257/E21.568

(Continued)

FOREIGN PATENT DOCUMENTS

JP 10122924 A * 5/1998
JP 2012156274 A * 8/2012

OTHER PUBLICATIONS

Tran, et al., "Synthesis of amorphous silica and sulfonic acid functionalized silica used as reinforced phase for polymer electrolyte membrane", Sep. 30, 2013, Adv. Nat. Sci.: Nanosci., Nanotechnol., vol. 4, 045007 (Year: 2013).*

(Continued)

*Primary Examiner* — Seth Dumbris
(74) *Attorney, Agent, or Firm* — Muncy, Geissler, Olds & Lowe, P.C.

(57) ABSTRACT

Disclosed are devices and methods for semiconductor devices including a ceramic substrate. Aspects disclosed include semiconductor device including an electrical component, an alumina ceramic substrate and a substrate-film. The substrate-film is deposited on the alumina ceramic substrate. The substrate-film has a planar substrate-film surface opposite the alumina ceramic substrate. The electrical component is formed on the substrate-film surface of the substrate-film on the alumina ceramic substrate.

25 Claims, 12 Drawing Sheets

(51) Int. Cl.
    *H01L 23/373*     (2006.01)
    *C04B 35/111*     (2006.01)
    *C04B 37/02*     (2006.01)
    *H03H 9/10*     (2006.01)
    *H03H 3/10*     (2006.01)
    *H01L 27/06*     (2006.01)
    *H03H 3/02*     (2006.01)

(52) U.S. Cl.
    CPC ..... *H03H 9/1014* (2013.01); *C04B 2235/963* (2013.01); *H03H 2003/027* (2013.01)

(56) References Cited

U.S. PATENT DOCUMENTS

2010/0260970 A1* 10/2010 Yeh ................ C04B 41/009
    428/141
2017/0229370 A1* 8/2017 Kreutzwiesner .... H01L 23/5389

OTHER PUBLICATIONS

Azo materials, "Silica-Silicon Dioxide (SiO2)", Accessed Feb. 23, 2023, https://www.azom.com/properties.aspx?ArticleID=1114 (Year: 2023).*

* cited by examiner

|  | Si | SiO2 | GaAs | SiC | CVD DIAMOND | SAPPHIRE | AlN | GLASS | ALUMINA |
|---|---|---|---|---|---|---|---|---|---|
| THERMAL COND [W/(cm.C)] | 1.3 | 0.013 | 0.46 | 4 | 10-15 | ~0.23 | 1.4-1.8 | 1.09 W/m-K | 36 W/m.K |
| DIELECTRIC CONST | 11.8 | 3.9 | 12.9 | 9.72 | 5.7 | 9.4 | 8.9 | 5.27 | 9.3 |
| RESISTIVITY [Ohm*cm] | 10-10K | 10G | 1e12 | 1M | 10G-10,000G | 1e14 | 1e14 | 1e13 | ~1e14 |
| LOSS TANGENT @10 GHz | 0.008 | 0.002 | 0.0016 | 0.003 | 0.00005 | 1e-4 | 3e-4 | 1e-3 | 1e-4 |
| CTE | 2.6 ppm/C | 1.1 ppm/C | 5.7 ppm/C | 4.0 ppm/C | 1.0 ppm/C | 6.9 ppm/C | 4.5 ppm/C | 3.2 ppm/C | 7-8 ppm/C |

FIG.10

DEVICE ON CERAMIC SUBSTRATE

CROSS-REFERENCE TO RELATED APPLICATIONS

The present Application for Patent claims the benefit of Provisional Patent Application No. 62/906,535 entitled DEVICE ON CERAMIC SUBSTRATE" filed on Sep. 26, 2019, assigned to the assignee hereof and hereby expressly incorporated herein by reference in its entirety.

FIELD OF DISCLOSURE

This disclosure relates generally to devices, such as integrated passive devices (IPD) formed on a ceramic substrate, and more specifically, but not exclusively, to IPD formed on a thermally conductive, electrically insulative ceramic substrate.

BACKGROUND

Integrated circuit technology has achieved great strides in advancing computing power through miniaturization of active components. Integrated passive components have also been miniaturized. As frequencies and data rates get higher, there is a need for further miniaturization of integrated passive components, for example, filters which include inductive (L) and capacitive (C) elements in integrated circuit devices. Additionally, to improve quality of received signals, certain components of a mobile device may be formed on an insulating substrate (such as, glass substrate). For example, an electrical component may be formed on a glass substrate to "isolate" the component in order to reduce effects of noise from other components of the mobile device.

Radio-frequency (RF) filters may include integrated passive devices (IPD), such as a passive-on-glass (POG) device (such as, a capacitor and/or an inductor). Glass may be desirable for its low loss tangent and is a preferred substrate material for example when used for RF IPD, acoustic resonators/filters and RF MEMS switches. The glass substrate provides lower insertion loss due to substrate loss as compared with silicon. However, glass has an inherent drawback of having a lower thermal conductivity as measured in Watts/meter-Kelvin (e.g., ~1.9 W/m-K vs silicon ~150 W/m-K). This lower thermal conductivity has limited the application of glass substrate devices for high power applications. Ceramic materials can have a lower loss tangent and higher thermal conductivity than glass. However, the ceramic substrates have a much greater surface roughness, which can be over two hundred times rougher than the glass substrate used for IPD (e.g., typically less than 0.2 mm). The rough surface of the substrate can adversely increase the metal film resistivity due to carrier scattering and can also reduce the metal insulator metal (MIM) capacitor dielectric electric strength/breakdown when the thin dielectric film is deposited on the bottom metal electrode that is formed on the rough substrate. This is not desirable for RF IPD and acoustic resonator devices.

Accordingly, there is a need for systems, apparatus, and methods that overcome the deficiencies of conventional approaches including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

At least one aspect includes a semiconductor device having an electrical component, an alumina ceramic substrate; and a substrate-film. The substrate-film is deposited on the alumina ceramic substrate. The substrate-film has a planar substrate-film surface opposite the alumina ceramic substrate. The electrical component is formed on the planar substrate-film surface of the substrate-film on the alumina ceramic substrate.

At least one additional aspect includes a method for fabricating a semiconductor device. The method includes depositing a substrate-film on an alumina ceramic substrate. The substrate-film is then polished to form a planar substrate-film surface of the substrate-film on the alumina ceramic substrate.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIG. 10 illustrates a table having various material values for substrates and substrate-films in accordance with some examples of the disclosure.

Figure 1:
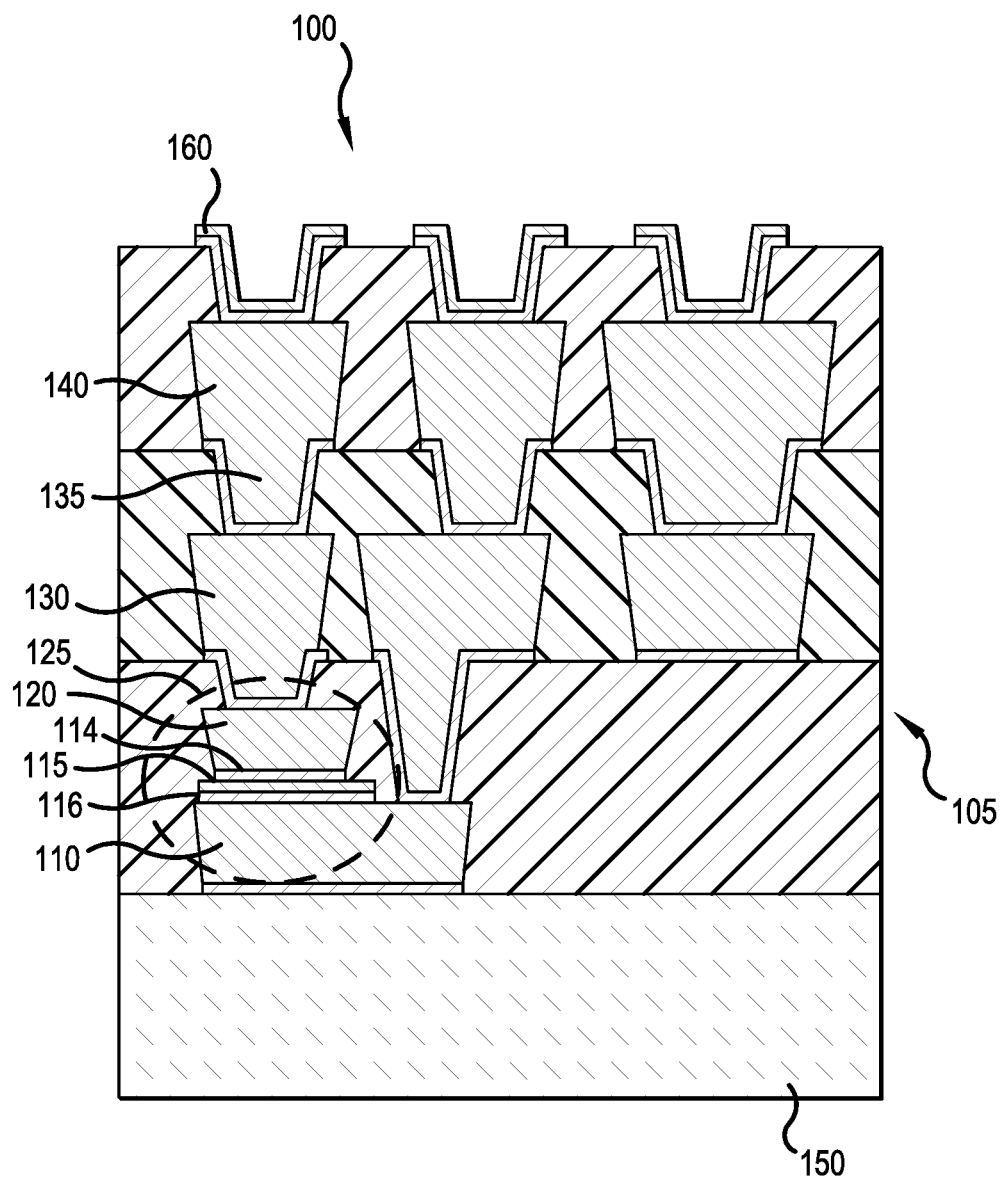
FIG. 1 illustrates a partial side view of a passive device with a ceramic substrate in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Recently, a new series of thin alumina ceramic ribbon substrate has been introduced which has a lower loss tangent ($1e^{-4}$, one order smaller than glass of $1e^{-3}$), and also offers 30× higher thermal conductivity (~36 W/m-K) than conventional glass substrates. Thus, the alumina ceramic material has a lower loss tangent and higher thermal conductivity along with higher coefficient of thermal expansion (CTE) when compared to glass substrates. The alumina ceramic substrate can be used as an alternative substrate for various devices such as, RF IPD, acoustic resonators/filters and RF MEMS switches. Additionally, it may be used for silicon devices for layer transfer to form RF silicon-on-insulator (SOI) devices. However, unlike the amorphous alumina-borosilicate glass, the alumina ceramic contains the polycrystalline alumina ($Al_2O_3$) in its ceramic ribbon forming process, which prohibits it from being able to be easily polished to form smooth surfaces like glass substrates. Therefore, as noted above, the alumina ceramic substrate has a greater surface roughness than glass and may nominally be 50 nm (or in the range of 40-60 nm), which is over two hundred times rougher than the conventional glass substrates used for IPD (e.g., which less than 0.2 nm). As noted above, the rough surface of the substrate can adversely increase the metal film resistivity due to carrier scattering and can also reduce the MIM dielectric electric strength/breakdown when the thin dielectric film is deposited on the bottom metal electrode formed on the rough substrate.

To address the deficiencies with ceramic substrates, aspects of the disclosure include methods of forming a planar high thermally conductive/electrically insulative ceramic substrate for RF IPD, acoustic resonator/filter and semiconductors devices. According to various aspects, a thin layer of amorphous thermally conductive but electrically insulative film is deposited on the alumina ceramic substrate. The film is polished, e.g., via mechanical polish or chemical assist mechanical polish (CMP) processes to smooth and planarize the substrate-film surface to a range of roughness within 10 nm (vs the original ~50 nm). In some aspects, the thermally conductive/electrically insulative film thickness is over 100 nm, which allows the film to fully cover the 40-60 nm surface roughness variation on the alumina ceramic substrate. Various aspects disclosed herein can use highly thermally conductive and electrically insulative materials and deposition methods, such as, room-temperature physical vapor deposition (RT-PVD) of alumina nitride (AlN) films, low temperature chemical vapor deposition (CVD) diamond films or silicon-carbide (SiC) films. The amorphous phase/structure of the film is preferred for the polishing process (e.g., CMP process) to form a smooth surface, as compared with the poly-crystalline film typically grown/formed at a higher temperature during the deposition.

FIG. 1 illustrates a partial side view of a passive device with a ceramic substrate in accordance with some examples of the disclosure. As shown in FIG. 1, a semiconductor device 100 may be a passive device and include an IPD 105 on an alumina substrate 150. Generally, as referred herein, the term alumina substrate includes an alumina ceramic substrate and planarized substrate-film (not individually illustrated in FIG. 1) but discussed in greater detail below). The IPD 105 may be formed as a multilayer component including a first metal layer M1 110 applied on the alumina substrate 150. As illustrated the IPD includes a plurality of metal layers, such as metal layer M1 110, metal layer M2 120, metal layer M3 130 and metal layer M4 140 on an alumina substrate 150. One or more through substrate vias (e.g., via 135), may be through-passivation vias in one example, and are used to electrically couple between the metal layers (e.g., M1, M2, M3 and M4). A MIM capacitor 125 may be formed in the IPD and includes a first metal layer (M1) 110, an insulating layer 115 and second metal layer (M2) 120. Optionally, the MIM capacitor 125 may include a top metal layer 114 coupled to M2 120 and/or a bottom metal layer 116 coupled to M1 110. A plurality of MIM capacitors 125 may be formed in the IPD. The insulating layer 115 may be a silicon nitride (SiN) compound or any other suitable insulating material. Additional metal layers (e.g., M3 130, M4 140) may be used for interconnections within and between the various layers using vias (e.g., via 135) to connect to the MIM capacitor 125 to external devices (e.g., via under bump metal layer (UBM) 160 which can be used for external connectors (e.g., solder balls, solder bumps, copper pillars, or any other suitable external connectors). Additionally, the various metal layers and vias may be used to connect the MIM capacitor to internal components of IPD 105, such as other capacitors or inductors. It will be appreciated, that the two thick metal layers M3 130 and M4 140, which in some examples may be on the order of 8 um to 16 um in thickness, may be used to form the inductors (not illustrated). The inductors may be formed with the winding routed in the thick layers (M3, M4) for improved inductor Q factor and RF performance. The formation of inductors and other components in an IPD is well known to those skilled in the art and therefore will not be detailed herein. Further, it will be appreciated that these illustrations are provided solely to aid in explanation and for illustration of the various aspects disclosed and not limitation thereof. For example, there may be more than two thick metal layers, they may be located in different layers, and may be of different thicknesses. Likewise, the MIM capacitors 125 may be formed in different layers, may be formed directly on one or more metal layers, may have additional insulating/dielectric layers and/or additional conductive plates (e.g., top metal 114 and/or bottom metal 116).

Figure 2:
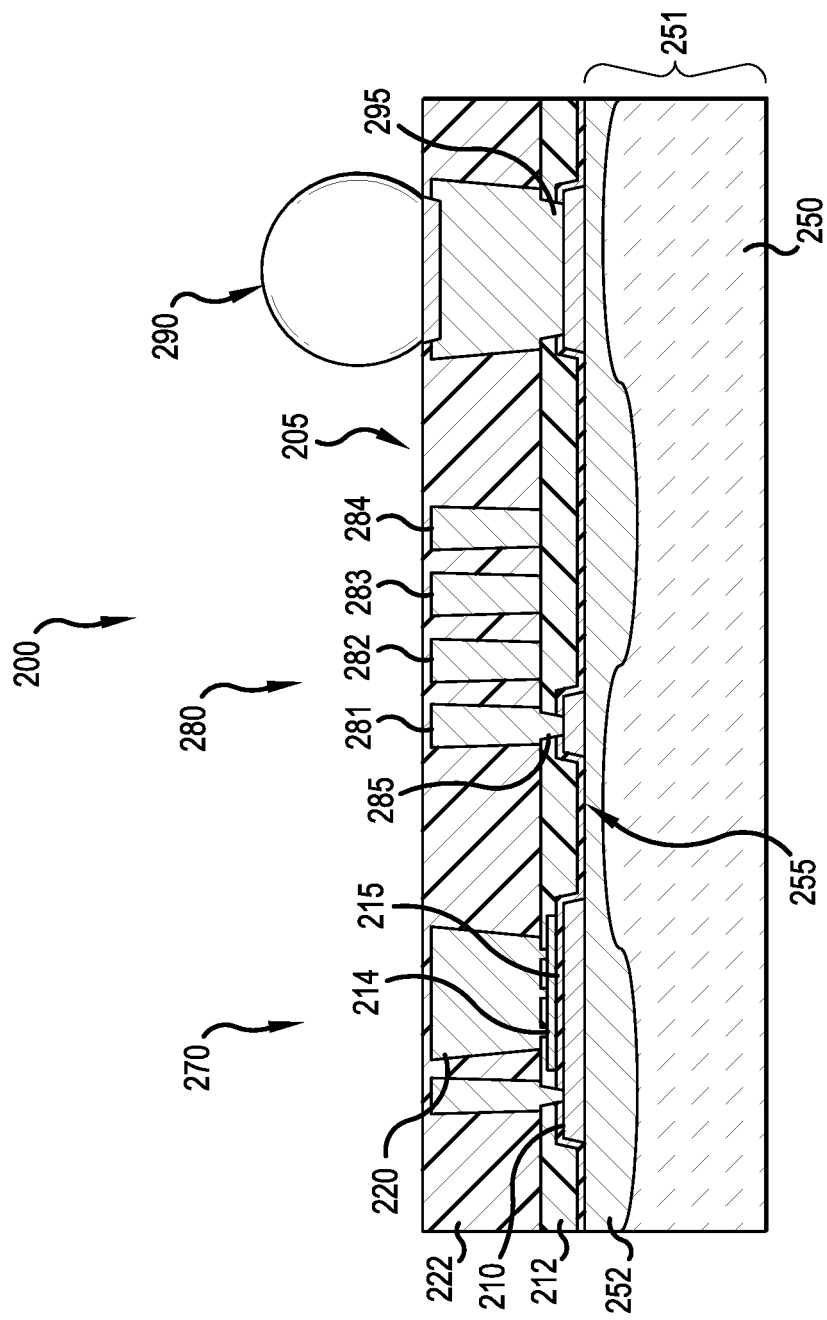
FIG. 2 illustrates a partial side view of a semiconductor device with a ceramic substrate in accordance with some examples of the disclosure.

FIG. 2 illustrates a partial side view of a semiconductor device 200 with a ceramic substrate in accordance with some examples of the disclosure. As shown in FIG. 2, the semiconductor device 200 may include an IPD 205 on an alumina substrate 251 The IPD 205 may be formed as a multilayer component including a first metal layer (M1) 210 applied on the alumina substrate 251. As illustrated the IPD 205 includes a plurality of metal layers, such as M1 210 and a second metal layer (M2) 220. It will be appreciated that IPD 205 may include additional metal layers (not illustrated). The metal layers may be formed of aluminum (AL), copper (Cu), silver (Ag), gold (Au) or other conductive materials, alloys or combinations thereof. Additionally, the particularly IPD 205 may also include a first inter-layer dielectric (ILD) 212 and a second ILD 222. The first ILD 212 and/or the second ILD layer 222 may be formed of a polyimide (PI), benzocyclobuten (BCB), polybenzoxazole (PBO), an acrylic, an epoxy, and/or any other suitable materials. These materials are provided as illustrative non-limiting examples. In some implementations, the first ILD 212 and the second ILD 222 may be formed from different materials. In other implementations, the first ILD 212 and the second ILD 222 may be formed from the same material. As discussed above, one or more through substrate vias, may be through-passivation vias (e.g., through-ILD), in one example, and used to electrically couple between the metal layers (e.g., M1 210, M2 220). A MIM capacitor 270 may be formed in the IPD 205. In the illustrated implementation, the MIM capacitor 270 has a top metal 214 formed over a dielectric layer 215 and the bottom metal is provided by M1 210. The top metal 214 is coupled to M2 220. An inductor 280 may also be formed using the metal layer M2 220. For example, winding portions 281, 282, 283 and 284 may be configured to form a spiral or other 2 dimensional configuration of inductor 280. Inductor 280 may be couple to M1 210 by via 285 for connection to the MIM capacitor 270 and/or an external connector 290. The external connector 290 (e.g., solder balls, solder bumps, copper pillars, or other external connector configurations), is illustrated as a wafer-level package (WLP) ball. The WLP ball 290 is coupled to the first metal layer M1 210 through the second metal layer M2 220 using via 295. Additionally, the various metal layers and vias may be used to couple the MIM capacitor 270, and/or inductor 280 to internal components of IPD 205, such as other capacitors or inductors (not illustrated). As noted above, the formation of inductors, MIM capacitors, internal routing, external connectors and other components in an IPD is well known to those skilled in the art and therefore will not be detailed herein.

As further illustrated in FIG. 2, the alumina substrate 251 includes a substrate-film 252 deposited over the rough/wavy surface of alumina ceramic substrate 250. The substrate-film 252 is used to form a planar substrate-film surface 255. According to various aspects, the substrate-film 252 is a thin layer of amorphous thermally conductive but electrically insulative film deposited on the alumina ceramic substrate 250. The substrate-film 252 is polished, e.g., via mechanical polishing or chemical mechanical polishing (CMP) processes to smooth and planarize the substrate-film surface 255 so that the substrate-film surface roughness is reduced to a range of 10 nm or less compared to a surface roughness of 40-60 nm of the alumina ceramic substrate 250. In some aspects, the substrate-film 252 thickness may initially be 100 nm or greater, which allows the substrate-film 252 to fully cover the 40-60 nm surface roughness on the alumina ceramic substrate 250. As used herein, the term surface roughness will include any variation (e.g., waviness, pits, bumps, etc.) in the surface of the material discussed. According to various aspects disclosed herein, the substrate-film 252 can be an Alumina Nitride (AlN) film, a diamond film, a silicon-carbide (SiC) film or other similar thermally-conductive electrically insulative film. Once again, it will be appreciated that the foregoing illustration was provided solely to aid in explanation and for illustration of the various aspects disclosed and not limitation thereof. For example, although not expressly illustrated a seed layer may be formed on the planar substrate-film surface 255 to aid in the adhesion and formation of the first metal layer M1 210. Additionally, there may be more than two metal layers, they may be located in different layers, and may be of different thicknesses. Likewise, the MIM capacitor 270 and inductor 280 may have different arrangements relative to each other and/or the external connector 290. Further, the IPD 205 is illustrated as an electrical component on the alumina ceramic substrate 250, but in the various aspects disclosed herein the electrical component is not limited to an IPD or other passive devices or circuits.

Figure 3:
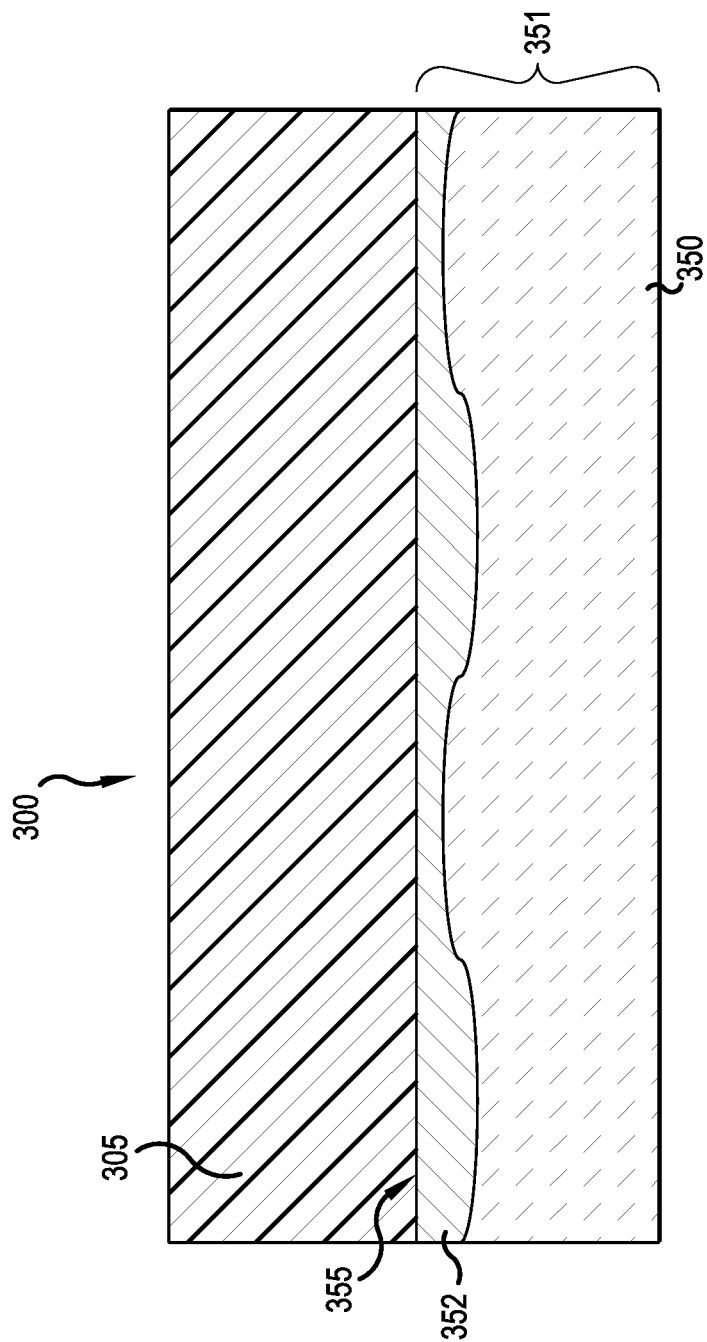
FIG. 3 illustrates a partial side view of a semiconductor device with a ceramic substrate in accordance with some examples of the disclosure

FIG. 3 illustrates a partial side view of a semiconductor device 300 with an alumina ceramic substrate 350 in accordance with some examples of the disclosure. As shown in FIG. 3, the semiconductor device 300 includes an electrical component 305 formed on the alumina ceramic substrate 350. It will be appreciated from the foregoing that the electrical component 305 may be any of a number of passive and/or active devices. For example, the electrical component 305 may include an IPD (e.g., as illustrated in FIGS. 1 and 2), an acoustic resonator and/or filter device (e.g., thin-film bulk acoustic resonator, surface acoustic wave (SAW) filter, bulk acoustic wave (BAW) filter, etc.), a radio frequency microelectromechanical system (RF-MEMS) switch device, RF silicon-on-insulator (SOI) device (e.g., including CMOS devices), among others electrical components that can benefit the various aspects disclosed herein. The various configurations in the foregoing example of the electrical component 305 are known to those skilled in the art and therefore detailed illustrations of each will not be provided herein. Further, regardless of the configuration of the electrical component 305, a substrate-film 352 is deposited on the alumina ceramic substrate 350 and has a planar substrate-film surface 355 opposite the alumina ceramic substrate 350. The electrical component 305 is formed on the planar substrate-film surface 355 of the substrate-film 352 on the alumina ceramic substrate 350. For convenience when the substrate is referred to as one entity herein as part of an assembly with the electrical component mounted thereon, it may be referred to as an alumina substrate 351, which will include the thin substrate-film 352, even if not expressly illustrated. As discussed herein, the thin substrate-film 352 can be applied to reduce the surface roughness of the alumina ceramic substrate 350, which allows for improved manufacturability and/or performance of the semiconductor device 300.

Figure 4:
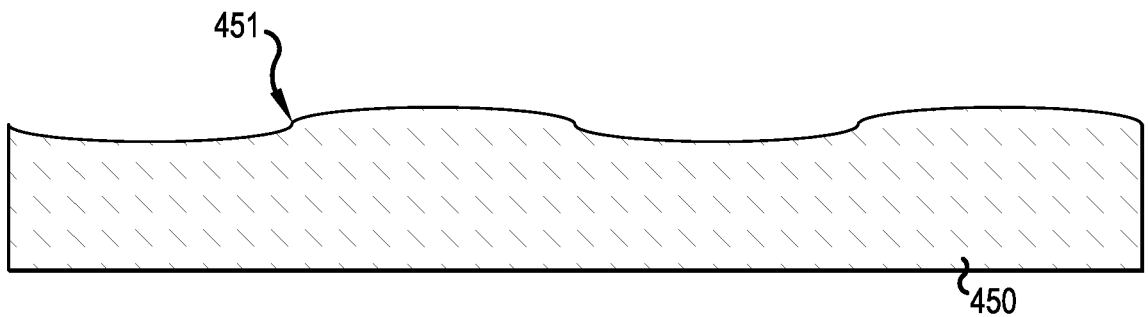
FIG. 4 illustrates a portion of a fabrication process of a semiconductor device in accordance with some examples of the disclosure.

FIG. 4 illustrates a portion of a fabrication process of a semiconductor device in accordance with some examples of the disclosure. As shown in FIG. 4, the alumina ceramic substrate 450 may be provided as a thin ribbon. The alumina ceramic substrate 450 has excessive surface roughness 451, which is illustrated generally as a wavy surface. However, it will be appreciated that the aspects disclosed herein can resolve the wavy surface problem and any additional or alternate cause or form of surface roughness may be addressed by the various aspects disclosed herein.

Figure 5:
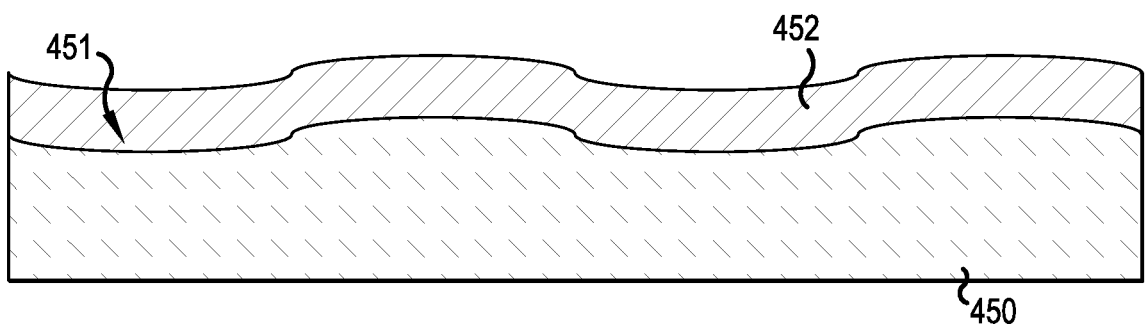
FIG. 5 illustrates a further portion of a fabrication process of a semiconductor device in accordance with some examples of the disclosure

FIG. 5 illustrates a further portion of a fabrication process of a semiconductor device in accordance with some examples of the disclosure. As shown in FIG. 5, the alumina ceramic substrate 450 has a substrate-film 452 deposited on a rough surface 451 of the alumina ceramic substrate 450. As discussed herein, the substrate-film 452 can be selected from amorphous thermally-conductive electrically insulative films. In some example aspects, the substrate-film 452 depositing may be performed by a room-temperature physical vapor deposition process (RT-PVD) for depositing an alumina nitride (AlN) film. Alternatively, the substrate-film 452 depositing may be performed by low temperature chemical vapor deposition (CVD), such as for depositing a diamond film or a silicon-carbide film. The excessive surface roughness of the rough surface 451 of alumina ceramic substrate 450 is illustrated generally as a wavy surface. The rough surface 451 will also impact the surface of the substrate-film at this stage as the deposited substrate-film will generally follow the contour of the rough surface 451. However, it will be appreciated that the wavy surface problem and any additional or alternate causes or forms of surface roughness may be addressed by the various aspects disclosed herein.

Figure 6A:
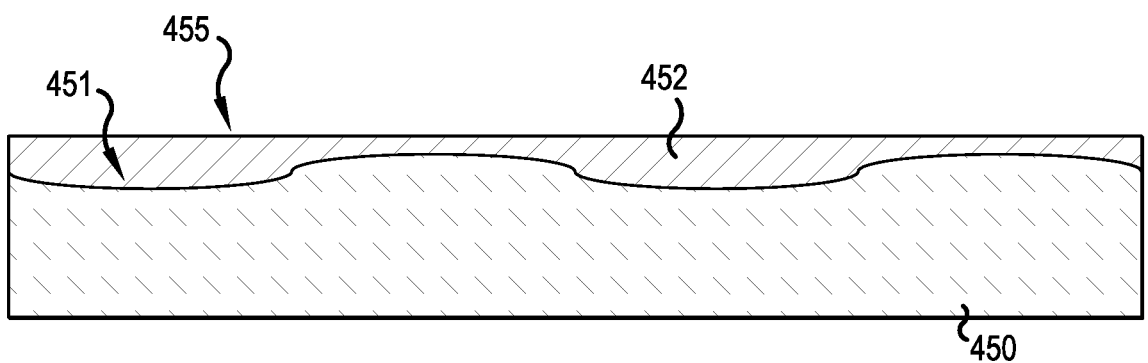
FIG. 6A-6H illustrate further portions of a fabrication process of a semiconductor device in accordance with some examples of the disclosure.

FIG. 6A illustrates a further portion of a fabrication process of a semiconductor device in accordance with some examples of the disclosure. As shown in FIG. 6A, the alumina ceramic substrate 450 has the substrate-film 452 deposited. However, a polishing operation has been performed on the substrate-film to form a planar substrate-film surface 455. It will be appreciated that the polishing can be performed by a variety of methods depending on the material of the substrate-film 452, fabrication preferences, and other processing considerations. For example, the substrate-film 452 may be mechanically polished or may be polished by performing a chemical mechanical polishing (CMP) process. The alumina ceramic substrate 450 under the polished substrate-film 452 will still have rough surface 451, as illustrated. However, the substrate-film surface 455 will be planarized and have a surface roughness on the order of 10 nm or less, which allows for the alumina ceramic substrate 450 to be used as a high performance substrate for the various electrical components discussed herein that formed on the alumina ceramic substrate 450. It will be appreciated that the illustrated patterning of FIG. 6A is provided solely as an example illustration and is not intended to limit the various aspects disclosed herein.

Figure 6B:
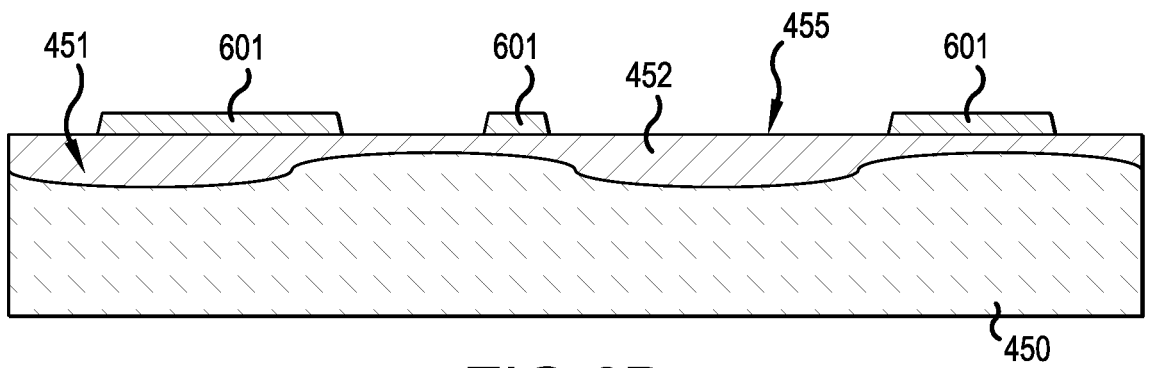

FIG. 6B illustrates a further portion of a fabrication process of a semiconductor device in accordance with some examples of the disclosure. As shown in FIG. 6B, the substrate-film 452 has been deposited on the alumina ceramic substrate 450 and has been processed to form the planar substrate-film surface 455. The planar substrate-film surface 455 is sufficiently planarized to allow for further processing. As illustrated a first metal layer M1 601 can be deposited on the surface 455. As mentioned above, and not expressly illustrated, a seed layer may be formed on the surface 455 to aid in the adhesion and formation of the first metal layer M1 601. The first metal layer M1 601 can be patterned after being deposited on the surface 455, to support the formation of various passive devices, active devices and/or interconnections. For example, M1 601 can be aluminum (Al) or copper (Cu) or any suitable conductive material. In one example aspect, M1 601 can be deposited by sputtering using PVD. After sputtering, the various structures/patterns can be formed by photolithography and etching. In other aspects, M1 601 can be deposited by an electro-plating process on a seed layer (not illustrated) and photoresist can be used to define various structures/patterns. It will be appreciated that the illustrated structures of FIG. 6B and discussed fabrication processes are provided solely as an example illustration and are not intended to limit the various aspects disclosed herein.

Figure 6C:
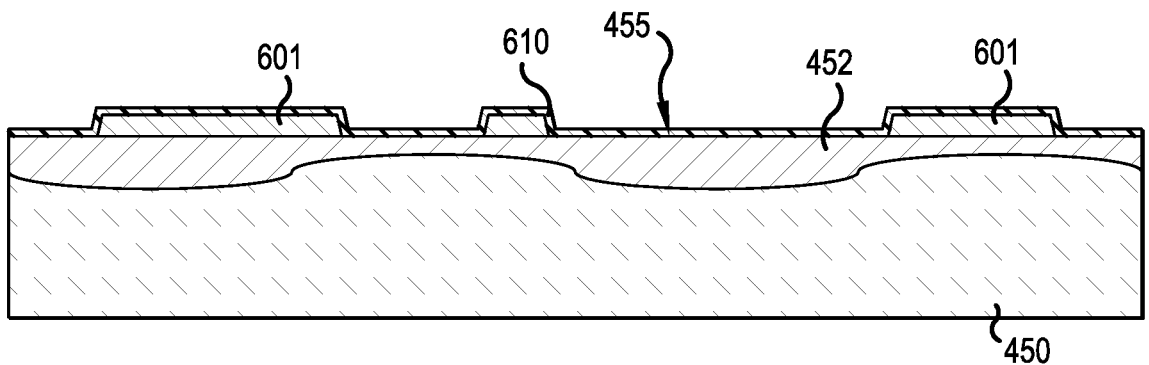

FIG. 6C illustrates a further portion of a fabrication process of a semiconductor device in accordance with some examples of the disclosure. As shown in FIG. 6C, the substrate-film 452 has been deposited on the alumina ceramic substrate 450 and has been processed to form the planar substrate-film surface 455. On the surface 455, the first metal layer M1 601 has been deposited and patterned. A dielectric film 610 can be deposited over the first metal layer M1 601 and also the exposed surface 455 of substrate-film 452, to support the formation of one or more MIM capacitors and/or other devices. The dielectric film 610 can be silicon nitride (SiNx) or silicon oxide (SiOx), metal oxide films such as aluminum oxide ($Al_2O_3$), or tantalum oxide ($Ta_2O_5$). It will be appreciated that the illustrated configuration of FIG. 6C is provided solely as an example illustration and is not intended to limit the various aspects disclosed herein.

Figure 6D:
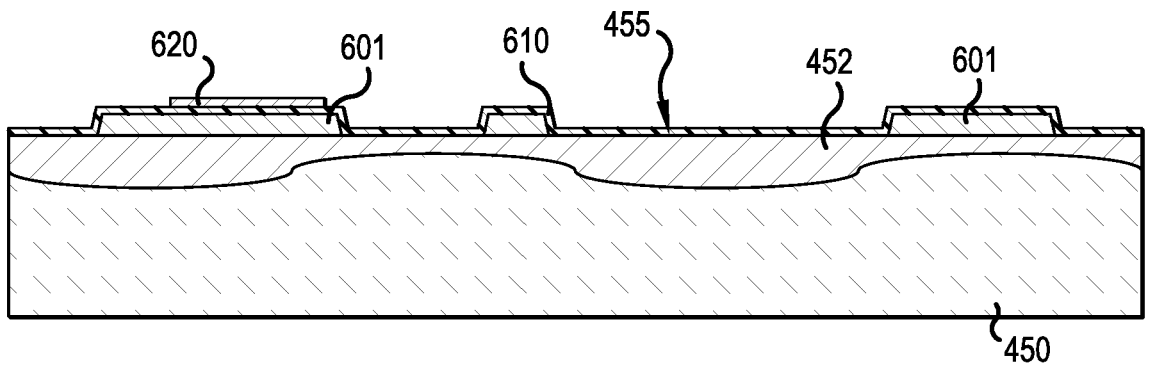

FIG. 6D illustrates a further portion of a fabrication process of a semiconductor device in accordance with some examples of the disclosure. As shown in FIG. 6D, the substrate-film 452 has been deposited on the alumina ceramic substrate 450 and has been processed to form the planar substrate-film surface 455. On the surface 455, the first metal layer M1 601 has been deposited and patterned and dielectric film 610 has been deposited. As further illustrated, a top metal layer 620 of a MIM capacitor can be formed over a portion of the dielectric film 610 as part of the formation of the MIM capacitor. The top metal layer 620 can be aluminum or copper and may be formed by PVD or electro-plating. It will be appreciated that the illustrated configuration of FIG. 6D is provided solely as an example illustration and is not intended to limit the various aspects disclosed herein.

Figure 6E:
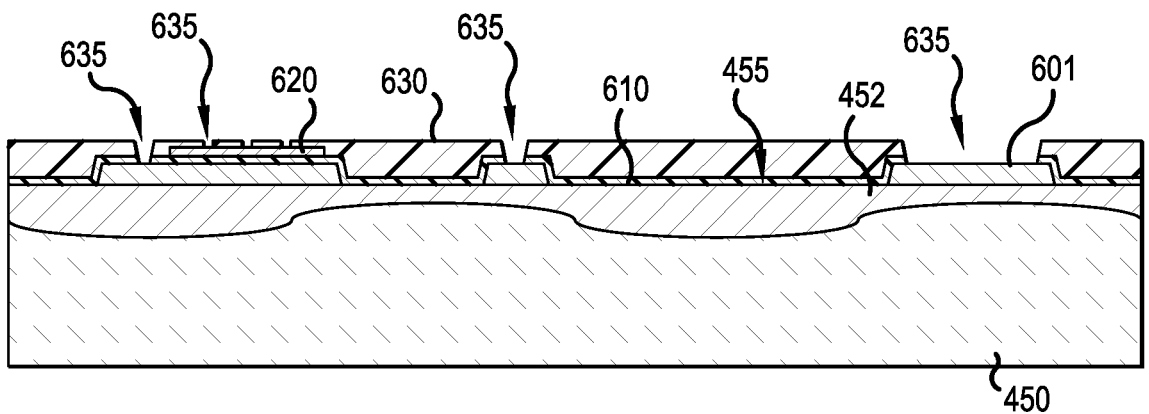

FIG. 6E illustrates a further portion of a fabrication process of a semiconductor device in accordance with some examples of the disclosure. As shown in FIG. 6E, the substrate-film 452 has been deposited on the alumina ceramic substrate 450 and has been processed to form the planar substrate-film surface 455. On the surface 455, the first metal layer M1 601 has been deposited and patterned and dielectric film 610 has been deposited. The top metal layer 620 is formed over a portion of the dielectric film 610. As further illustrated a first inter-layer dielectric (ILD) 630 is deposited on over the assembly. The first ILD 630 may be formed of polyimide (PI), benzocyclobuten (BCB), polybenzoxazole (PBO), an acrylic, an epoxy, and/or other materials, as illustrative non-limiting examples. The first ILD 630 is patterned to form openings 635 in the first ILD 630 to allow for coupling to the various metal layers (e.g., 601 and 620) of the assembly covered by the first ILD 630. Additionally, the formation of the openings 635 also includes forming openings in the dielectric film 610 in some portions to allow access to M1 601. The openings 635 may be formed by photolithography or any suitable process. It will be appreciated that the illustrated configuration of FIG. 6E is provided solely as an example illustration and is not intended to limit the various aspects disclosed herein.

Figure 6F:
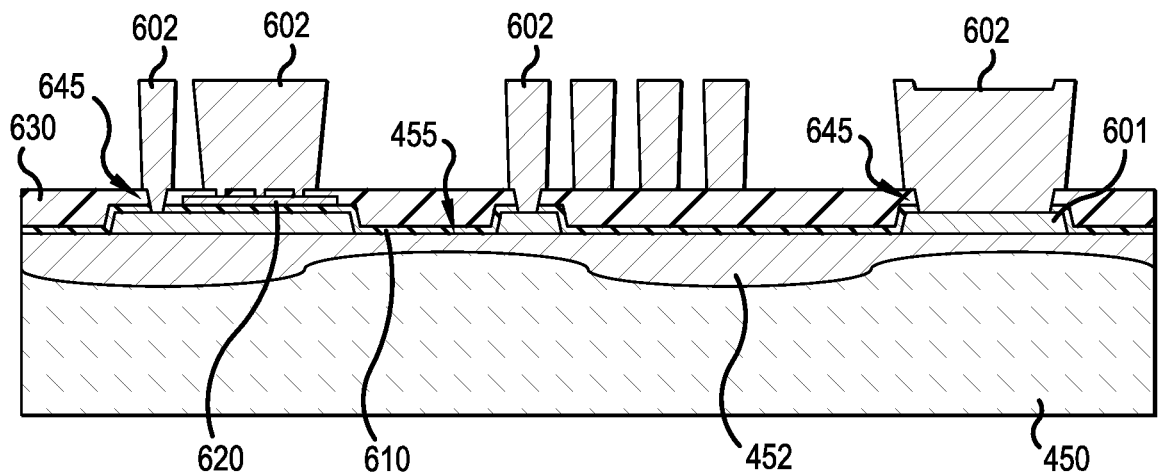

FIG. 6F illustrates a further portion of a fabrication process of a semiconductor device in accordance with some examples of the disclosure. As shown in FIG. 6F, the substrate-film 452 has been deposited on the alumina ceramic substrate 450 and has been processed to form the planar substrate-film surface 455. On the planar substrate-film surface 455, the first metal layer M1 601 has been deposited and patterned and dielectric film 610 has been deposited. The top metal layer 620 is formed over a portion of the dielectric film 610 and a first inter-layer dielectric (ILD) 630 has also been deposited. Vias 645 are formed in the first ILD 630 to allow for connections to the various metal layers (e.g., 601 and 620) and the newly formed second metal layer M2 602. It will be appreciated that the vias 645 were formed in the openings 635 (illustrated in FIG. 6E) and may be formed in a separate process or as part of the formation of M2 602 (e.g., the depositing of a metal layer and patterning of the deposited layer). The second metal layer M2 602 can be patterned, after being deposited on the first ILD 630, to support the formation of various passive devices, active devices and/or interconnections. It will be appreciated that the illustrated configuration of FIG. 6F is provided solely as an example illustration and is not intended to limit the various aspects disclosed herein.

Figure 6G:
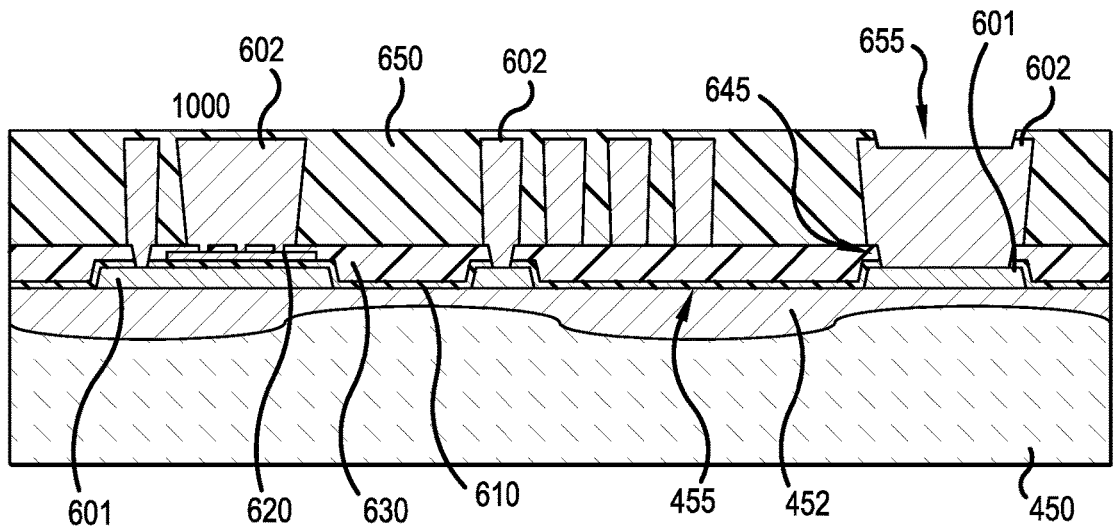

FIG. 6G illustrates a further portion of a fabrication process of a semiconductor device in accordance with some examples of the disclosure. As shown in FIG. 6G, the substrate-film 452 has been deposited on the alumina ceramic substrate 450 and has been processed to form the planar substrate-film surface 455. On the planar substrate-film surface 455, the first metal layer M1 601 has been deposited and patterned and dielectric film 610 has been deposited. The top metal layer 620 is formed over a portion of the dielectric film 610 and a first inter-layer dielectric (ILD) 630 has also been deposited. Vias 645 are formed in the first ILD 630 to allow for connections to the second metal layer M2 602. In a further process, a second ILD 650 is deposited over the first ILD 630 and second metal layer M2 602. The second ILD 650 may be formed of polyimide (PI), benzocyclobuten (BCB), polybenzoxazole (PBO), an acrylic, an epoxy, and/or other materials, as illustrative non-limiting examples. The second ILD is also patterned to form an opening 655, to allow access to a portion of the second metal layer M2. It will be appreciated that the illustrated configuration of FIG. 6G is provided solely as an example illustration and is not intended to limit the various aspects disclosed herein.

Figure 6H:
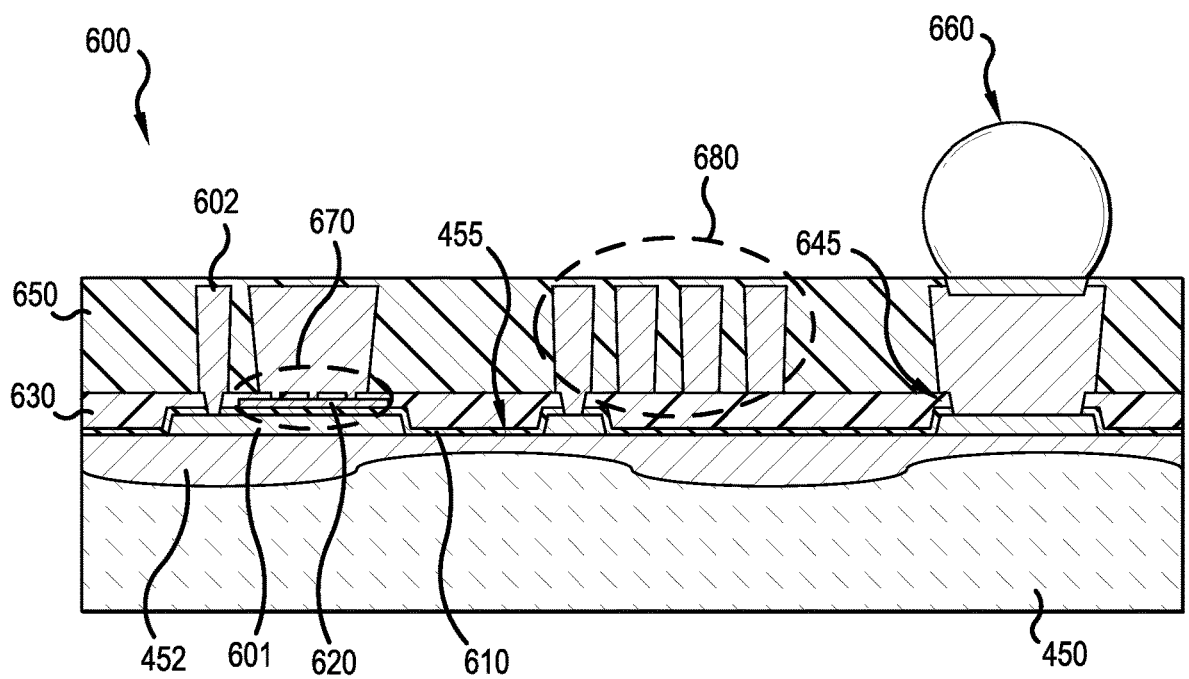

FIG. 6H illustrates a further portion of a fabrication process of a semiconductor device 600 in accordance with some examples of the disclosure. As shown in FIG. 6H, the alumina ceramic substrate 450 has the substrate-film 452 which has been processed to form a planar substrate-film surface 455. On the planar substrate-film surface 455, the first metal layer M1 601, dielectric film 610, top metal layer 620 formed over a portion of the dielectric film 610 are covered by the first ILD 630. Vias 645 are formed in the first ILD 630 to allow for connections to the second metal layer M2 602, which is covered by the second ILD 650. An external connector 660 (e.g., solder balls, solder bumps, copper pillars, or other external connectors) is formed. The external connector 660 is coupled to the second metal layer M2 602 and through via 645 to the first metal layer M1 601. As discussed in the foregoing, the various layers can be used to form various devices. As illustrated, a MIM capacitor 670 can be formed by the top metal layer 620, a portion of dielectric 610 and the first metal layer M1 601. Also, as illustrated, a 2D inductor 680 can be formed by primarily using a portion the second metal layer M2 602, with a coupling to the first metal layer M1 601. The resulting semiconductor device 600 illustrated is similar to the semiconductor device 200 illustrated in FIG. 2. It will be appreciated that the illustrated configuration of FIG. 6H is provided solely as an example illustration and is not intended to limit the various aspects disclosed herein.

Figure 7:
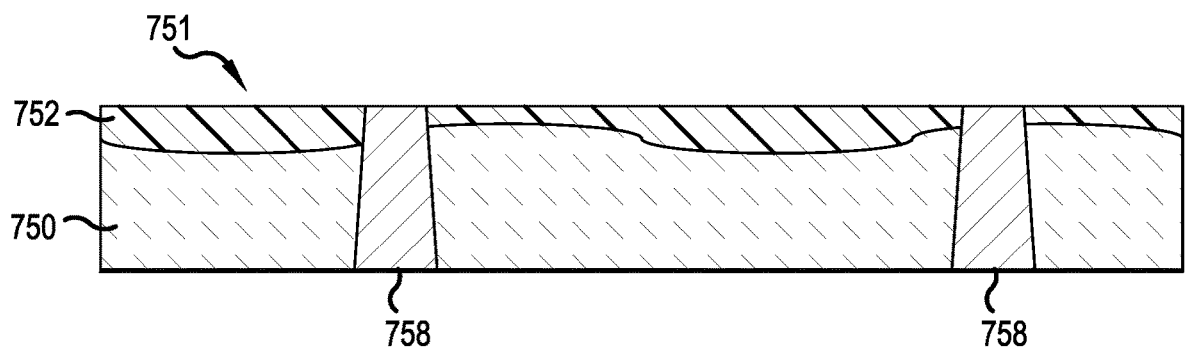
FIG. 7 illustrates a further portion of a fabrication process of a semiconductor device in accordance with some examples of the disclosure.

FIG. 7 illustrates a further portion of a fabrication process of a semiconductor device in accordance with some examples of the disclosure. As shown in FIG. 7, the alumina substrate 751 includes the polished substrate-film 752 and alumina ceramic substrate 750. The alumina substrate 751 has vias 758 formed through the alumina substrate 751. The vias 758 may also be referred herein as through alumina via (TAV) 758. The TAV 758 may be formed by laser drilling or other methods. The TAV 758 may be filled with copper, or other suitable conductive materials as discussed herein. Filling the TAV 758 with conductive material may be performed by sputtering, plating or any other known technique. TAVs 758 allow for the electrical coupling of one or more electrical components formed on smoothed surface of the alumina substrate 751 to be coupled to external devices on the opposite side of alumina substrate 751. Alternatively or in addition to the external coupling, one or more TAVs 758 may allow additional electrical coupling to one or more electrical components formed on the alumina substrate 751, as is common in glass substrates or other substrates. However, without the improved planarity in accordance with the various aspects disclosed herein, fabricating TAVs 758 would not be practical at a commercial scale.

Figure 8:
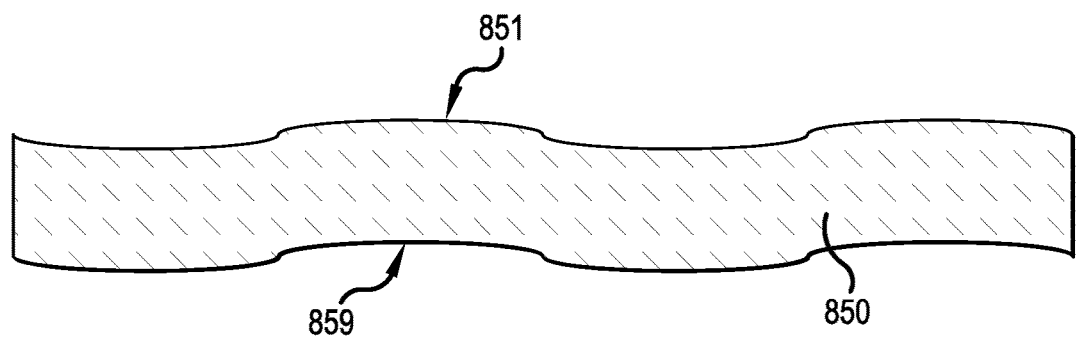
FIG. 8 illustrates a portion of a fabrication process of a semiconductor device in accordance with some examples of the disclosure.

FIG. 8 illustrates a portion of a fabrication process of a semiconductor device in accordance with some examples of the disclosure. As shown in FIG. 8, the alumina ceramic substrate 850 may be provided as a thin ribbon. The alumina ceramic substrate 850 may have excessive surface roughness on a top surface 851 and excessive surface roughness on a bottom surface 859, each illustrated generally as a wavy surface. However, it will be appreciated that the surface roughness may be any form of surface roughness.

Figure 9:
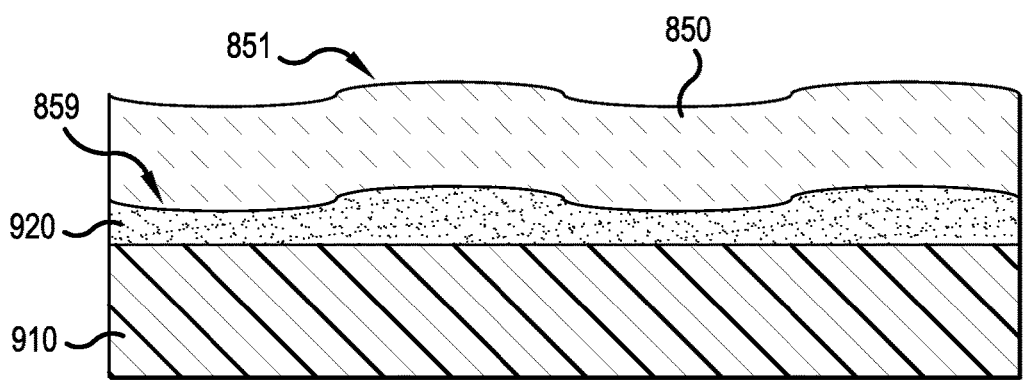
FIG. 9 illustrates a portion of a fabrication process of a semiconductor device in accordance with some examples of the disclosure.

FIG. 9 illustrates a portion of a fabrication process of a semiconductor device in accordance with some examples of the disclosure. As shown in FIG. 9, the alumina ceramic substrate 850 may have excessive surface roughness on the top surface 851 and excessive surface roughness on the bottom surface 859, as noted above. To address the excessive surface roughness on the bottom surface 859, the alumina ceramic substrate 850 may be fastened to a carrier 910 using adhesive 920. The carrier 910 allows for improved fabrication handling and processing of the alumina ceramic substrate 850 during fabrication processing and may be used in combination with the various fabrication process disclosed herein. The foregoing disclosure already addressed various aspects for resolving the excessive surface roughness, such as on the top surface 851, so additional repetition of these aspects will not be provided here to address the excessive surface roughness on the top surface 851 and/or bottom surface 859. It will be appreciated that in some implementations one surface may be processed to have a smooth planar surface, whereas in other implementations both the top surface 851 and the bottom surface 859 may be processed to have smooth planar surfaces, using the various aspects disclosed herein.

FIG. 10 illustrates a table having various material values for substrates and substrate-films in accordance with some examples of the disclosure. As shown in FIG. 10, various properties, such as thermal conductivity in watts per centimeter-Celsius (W/(cm·C)), dielectric constant, resistivity [Ohm*cm], loss tangent @ 10 GHz, and CTE are provided for various materials. It will be appreciated that these properties may be used to select appropriate substrate materials for various electrical components, such as RF circuits and filters, among other designs. For example, as can be seen from the table, and discussed herein, alumina has a much better thermal conductivity than the glass material. It also has a higher dielectric constant among the other properties. Alumina nitride (AlN) has a similar dielectric constant, resistivity, and loss tangent at 10 GHz, which makes it a suitable material for the substrate-film. A detailed discussion of the various properties of potential materials is beyond the scope of this disclosure, but is known to those skilled in the art. Accordingly, it will be appreciated that this listing is provided merely as an example of some considerations of material properties for various materials that may be used according the various aspects disclosed herein.

In accordance with the various aspects disclosed herein, at least one aspect includes a semiconductor device having an electrical component (e.g., 205, 305, etc.) an alumina ceramic substrate (e.g., 250, 350, 450, etc.) and a substrate-film (e.g., 252, 352, 452, etc.). The substrate-film (e.g., 252, 352, 452, etc.) is deposited on the alumina ceramic substrate (e.g., 250, 350, 450, etc.). The substrate-film (e.g., 252, 352, 452, etc.) has a planar substrate-film surface (e.g., 255, 355, 455, etc.) opposite the alumina ceramic substrate (e.g., 252, 352, 452, etc.). The electrical component (e.g., 205, 305, etc.) is formed on the planar substrate-film surface (e.g., 255, 355, 455, etc.) of the substrate-film on the alumina ceramic substrate (e.g., 250, 350, 450, etc.). Among the various technical advantages the various aspects disclosed provide, in at least some aspects, the features such as the alumina ceramic substrate and substrate-film with the planar substrate-film surface provide for the improved thermal, dielectric and other characteristics of the alumina ceramic substrate, while allowing for an efficient fabrication process due to the planar substrate-film surface on which the electrical components can be formed.

Further aspects may include one or more of the following features and each of the features may be combined into one or more of the disclosed aspects. The further aspects may include the semiconductor device where the substrate-film is an amorphous thermally-conductive electrically insulative film. The semiconductor device where the substrate-film is an alumina nitride (AlN) film. The semiconductor device where the substrate-film is a diamond film. The semiconductor device where the substrate-film is a silicon-carbide (SiC) film. The semiconductor device where the substrate-film has a thickness greater than a surface roughness of the alumina ceramic substrate. The semiconductor device where the alumina ceramic substrate has a surface roughness on an order of 40 nanometers to 60 nanometers. The semiconductor device where the planar substrate-film surface has a surface roughness on an order of 10 nanometers or less. The semiconductor device where the electrical component is an integrated passive device having multiple metal layers. The semiconductor device where the integrated passive device has at least one inductor and at least one metal insulator metal (MIM) capacitor. The semiconductor device where the at least one MIM capacitor is formed from adjacent metal layers of the multiple metal layers. The semiconductor device where the at least one inductor is formed on adjacent metal layers of the multiple metal layers. The semiconductor device where the adjacent metal layers are thick metal layers. The semiconductor device where the adjacent metal layers are on an order of 8 um to 16 um in thickness. The semiconductor device where the electrical component is an acoustic resonator or acoustic filter. The semiconductor device where the electrical component is at least one of a thin-film bulk acoustic resonator, surface acoustic wave (SAW) filter or bulk acoustic wave (BAW) filter. The semiconductor device where the electrical component is a silicon-on-insulator device. The semiconductor device where the silicon-on-insulator device includes at least one complementary metal oxide semiconductor (CMOS) device. The semiconductor device where the electrical component is a radio frequency microelectromechanical system (RF-MEMS) switch.

The foregoing disclosed devices and functionalities may be designed and configured into computer files (e.g., RTL, GDSII, GERBER, etc.) stored on computer-readable media. Some or all such files may be provided to fabrication handlers who fabricate the various disclosed semiconductor devices based on such files. Resulting products may include semiconductor wafers that are then cut into semiconductor die and packaged into a semiconductor chip. The chips may then be employed in devices described herein.

In order to fully illustrate aspects of the design of the present disclosure, methods of fabrication are presented. Other methods of fabrication are possible, and discussed fabrication methods are presented only to aid understanding of the concepts disclosed herein and are not intended to limit the various aspects disclosed or claimed.

Figure 11:
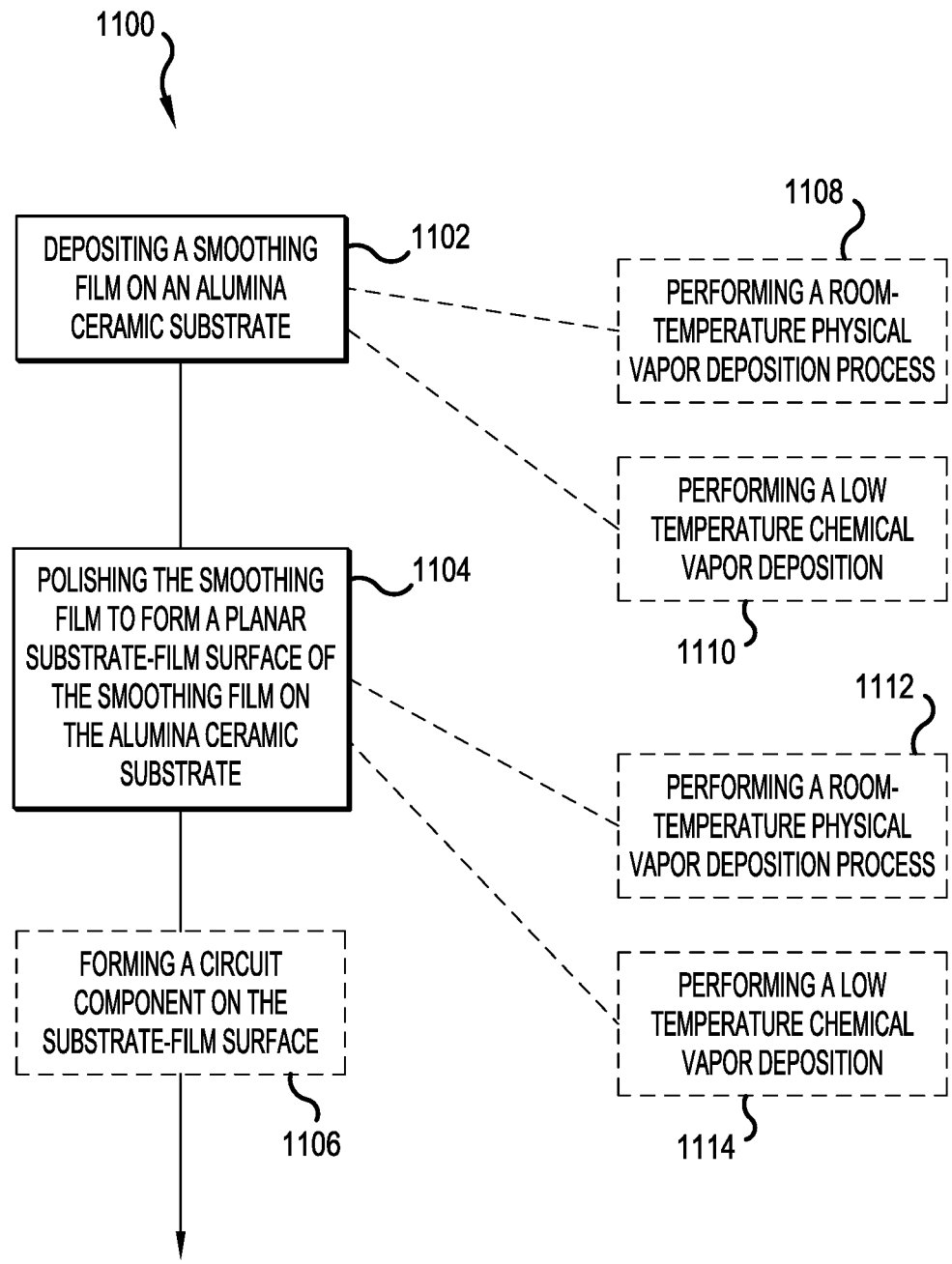
FIG. 11 illustrates a flowchart of a method for manufacturing a semiconductor device in accordance with some examples of the disclosure.

It will be appreciated from the foregoing that there are various methods for fabricating semiconductor devices including an alumina substrate (including a substrate-film and alumina ceramic substrate), as disclosed herein. FIG. 11 illustrates a flowchart of a method for fabricating a semiconductor device in accordance with some examples of the disclosure. As shown in FIG. 11, the method 1100 may begin in block 1102 with depositing a substrate-film (e.g., 252, 352, 452, etc.) on an alumina ceramic substrate (e.g., 250, 350, 450, etc.). The method 1100 may continue in block 1104 with polishing the substrate-film to form a planar substrate-film surface (e.g., 255, 355, 455, etc.) of the substrate-film on the alumina ceramic substrate. As discussed in the foregoing, the polishing provides for the substrate-film surface to be planarized by removing the reflected surface roughness of the alumina ceramic substrate on the substrate-film when deposited on the alumina ceramic substrate. The substrate-film surface roughness may be reduced to 10 nm or less, in some aspects, as discussed in the foregoing disclosure. Optional aspects can also be recognized from the foregoing disclosure. For example, optionally, at block 1106, the method 1100 can continue with forming an electrical component on the substrate-film surface (e.g., IPD 205, electrical component 305, etc.). Other optional aspects of the method 1100 may include where the depositing is performed using a room-temperature physical vapor deposition process, in block 1108 or, in block 1110, where the depositing is performed using a low temperature chemical vapor deposition, each of which are discussed in the foregoing disclosure. The method 1100 may continue with optional aspects of polishing, in block 1112 by mechanically polishing the substrate-film or in block 1114, by performing a chemical mechanical polishing (CMP) process on the substrate-film to form the planar substrate-film surface. These and additional aspects are discussed in the foregoing disclosure. Accordingly, it will be appreciated from the foregoing disclosure that additional processes for fabricating the various aspects disclosed herein will be apparent to those skilled in the art and a literal rendition of the processes discussed above will not be provided or illustrated in the included drawings.

Figure 12:
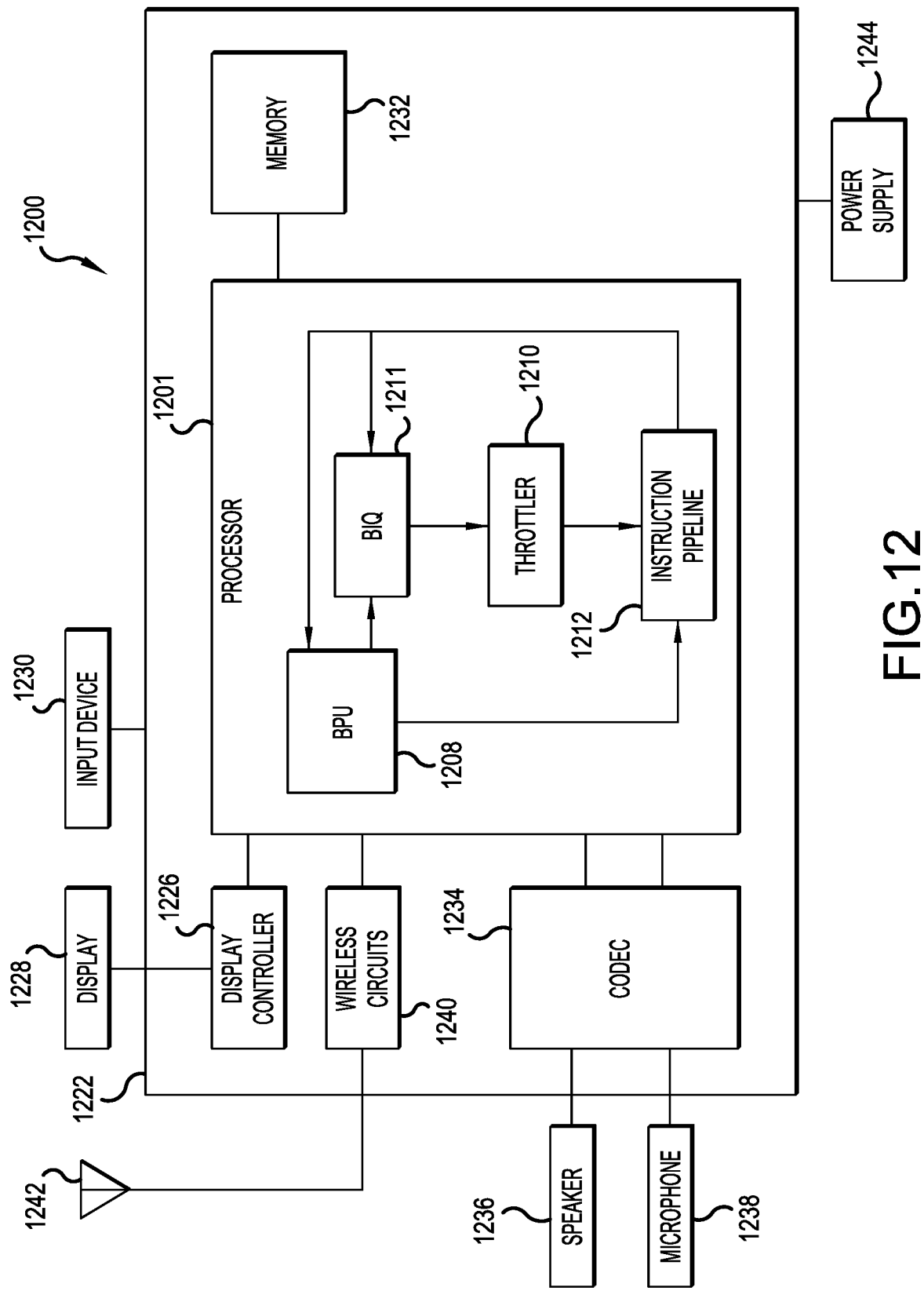
FIG. 12 illustrates a mobile device in accordance with some examples of the disclosure

FIG. 12 illustrates a mobile device in accordance with some examples of the disclosure. Referring now to FIG. 12, a block diagram of a mobile device that is configured according to aspects is depicted and generally designated mobile device 1200. In some aspects, mobile device 1200 may be configured as a wireless communication device. As shown, mobile device 1200 includes processor 1201, which may be configured to implement the methods described herein in some aspects. Processor 1201 is shown to include instruction pipeline 1212, buffer processing unit (BPU) 1208, branch instruction queue (BIQ) 1211, and throttler 1210 as is well known in the art. Other well-known details (e.g., counters, entries, confidence fields, weighted sum, comparator, etc.) of these blocks have been omitted from this view of processor 1201 for the sake of clarity. Processor 1201 may be communicatively coupled to memory 1232 over a link, which may be a die-to-die or chip-to-chip link. Mobile device 1200 also includes display 1228 and display controller 1226, with display controller 1226 coupled to processor 1201 and to display 1228.

In some aspects, FIG. 12 may include coder/decoder (CODEC) 1234 (e.g., an audio and/or voice CODEC) coupled to processor 1201; speaker 1236 and microphone 1238 coupled to CODEC 1234; and wireless circuits 1240 (which may include a modem, RF circuitry, filters, etc., which may be implemented using one or more semiconductor devices with alumina substrates, as disclosed herein) coupled to wireless antenna 1242 and to processor 1201.

In a particular aspect, where one or more of the above-mentioned blocks are present, processor 1201, display controller 1226, memory 1232, CODEC 1234, and wireless circuitry 1240 can be included in a system-in-package or system-on-chip device 1222. Input device 1230 (e.g., physical or virtual keyboard), power supply 1244 (e.g., battery), display 1228, input device 1230, speaker 1236, microphone 1238, wireless antenna 1242, and power supply 1244 may be external to system-on-chip device 1222 and may be coupled to a component of system-on-chip device 1222, such as an interface or a controller.

It should be noted that although FIG. 12 depicts a mobile device, processor 1201 and memory 1232 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 13:
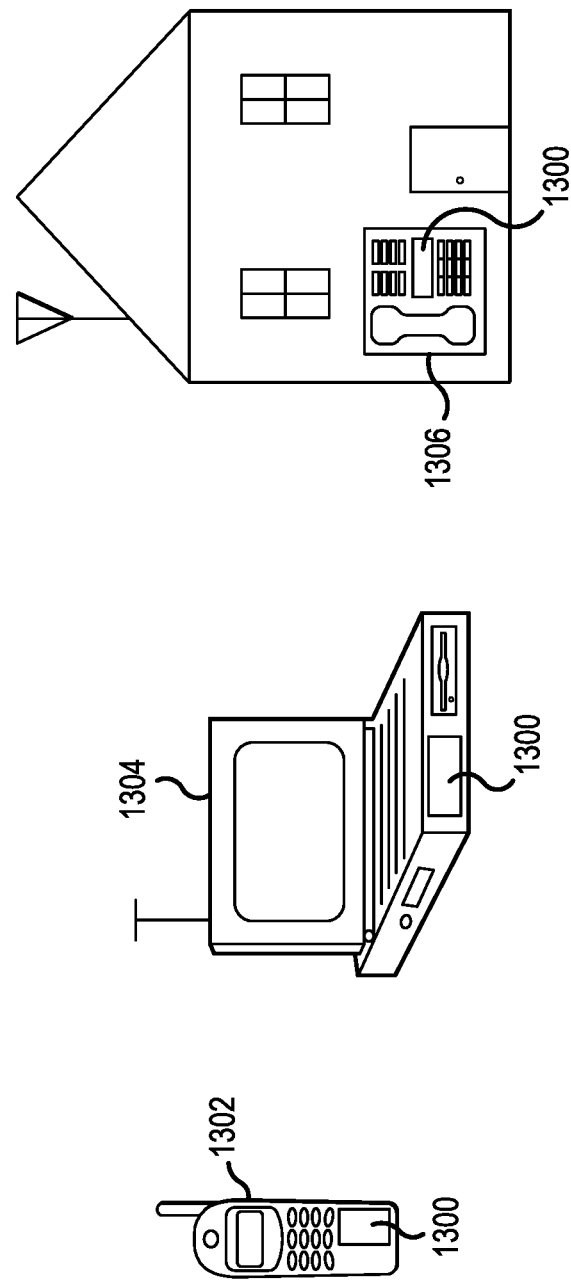
FIG. 13 illustrates various electronic devices that may be integrated with any of the aforementioned integrated device or semiconductor device accordance with various examples of the disclosure.

FIG. 13 illustrates various electronic devices that may be integrated with any of the aforementioned integrated device or semiconductor device accordance with various examples of the disclosure. For example, a mobile phone device 1302, a laptop computer device 1304, and a fixed location terminal device 1306 may each be consider generally user equipment (UE) and may include a semiconductor device 1300 including an alumina substrate, as described herein. The semiconductor device 1300 may be, for example, any of the integrated circuits, dies, integrated devices, integrated device packages, integrated circuit devices, device packages, integrated circuit (IC) packages, package-on-package devices described herein. The devices 1302, 1304, 1306 illustrated in FIG. 13 are merely examples. Other electronic devices may also feature the semiconductor device 1300 including, but not limited to, a group of devices (such as, electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (such as, autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may include a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-13 may be rearranged and/or combined into a single component, process, feature or function or incorporated in several components, processes, or functions. Additional elements, components, processes, and/or functions may also be added without departing from the disclosure. It should also be noted that FIGS. 1-13 and corresponding description in the present disclosure are not limited to dies and/or ICs. In some implementations, FIGS. 1-13 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (such as, wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (such as, based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (such as, a reverse traffic channel, a reverse control channel, an access channel, etc.). A communication link through which the RAN can send signals to UEs is called a downlink or forward link channel (such as, a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected", "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first", "second," and so forth does not limit the quantity and/or order of those elements. Rather, these designations are used as a convenient method of distinguishing between two or more elements and/or instances of an element. Also, unless stated otherwise, a set of elements can include one or more elements.

Additionally, a person having ordinary skill in the art will readily appreciate, the terms "upper" and "lower", "top" and "bottom", and variants thereof are sometimes used for ease of describing the figures, and indicate relative positions corresponding to the orientation of the figure on a properly oriented page, and may not reflect the proper orientation of any device as implemented.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the method actions can be performed by such apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, and each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A semiconductor device comprising:
   an electrical component;
   an alumina ceramic substrate; and
   a substrate-film on and in direct contact with the alumina ceramic substrate, the substrate-film having a planar substrate-film surface opposite the alumina ceramic substrate,
   wherein the electrical component is formed on the planar substrate-film surface of the substrate-film on the alumina ceramic substrate,
   wherein a thermal conductivity of the substrate-film is greater than a thermal conductivity of glass, and
   wherein a surface roughness of the planar substrate-film surface is less than a surface roughness of the alumina ceramic substrate.

2. The semiconductor device of claim 1, wherein the substrate-film is an amorphous thermally-conductive electrically insulative film.

3. The semiconductor device of claim 2, wherein the substrate-film is an alumina nitride (AlN) film.

4. The semiconductor device of claim 2, wherein the substrate-film is a diamond film.

5. The semiconductor device of claim 2, wherein the substrate-film is a silicon-carbide (SiC) film.

6. The semiconductor device of claim 1, wherein the substrate-film has a thickness greater than the surface roughness of the alumina ceramic substrate.

7. The semiconductor device of claim 6, wherein the alumina ceramic substrate has the surface roughness on an order of 40 nanometers to 60 nanometers.

8. The semiconductor device of claim 1, wherein the planar substrate-film surface has the surface roughness on an order of 10 nanometers or less.

9. The semiconductor device of claim 1, wherein the electrical component is an integrated passive device comprising multiple metal layers formed on and above the alumina ceramic substrate, the integrated passive device being formed integral with the alumina ceramic substrate and the substrate-film.

10. The semiconductor device of claim 9, wherein the integrated passive device has at least one inductor and at least one metal insulator metal (MIM) capacitor.

11. The semiconductor device of claim 10, wherein the at least one MIM capacitor is formed from adjacent metal layers of the multiple metal layers.

12. The semiconductor device of claim 10, wherein the at least one inductor is formed on adjacent metal layers of the multiple metal layers.

13. The semiconductor device of claim 12, wherein the adjacent metal layers are thick metal layers.

14. The semiconductor device of claim 13, wherein the adjacent metal layers are on an order of 8 um to 16 um in thickness.

15. The semiconductor device of claim 1, wherein the electrical component is an acoustic resonator or acoustic filter.

16. The semiconductor device of claim 15, wherein the electrical component is at least one of a thin-film bulk acoustic resonator, surface acoustic wave (SAW) filter or bulk acoustic wave (BAW) filter.

17. The semiconductor device of claim 1, wherein the electrical component is a silicon-on-insulator device.

18. The semiconductor device of claim 17, wherein the silicon-on-insulator device includes at least one device.

19. The semiconductor device of claim 1, wherein the electrical component is a radio frequency microelectromechanical system (RF-MEMS) switch.

20. The semiconductor device of claim 1, wherein the semiconductor device is incorporated into an apparatus, wherein the apparatus is at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

21. The semiconductor device of claim 1, further comprising:
   a plurality of metal layers on and above the substrate-film,
   wherein the electrical component comprises one or more of the plurality of metal layers.

22. The semiconductor device of claim 21, further comprising:
   a plurality of inter-layer dielectrics (ILD); and
   a plurality of vias electrically coupling the plurality of metal layers,
   wherein the plurality of metal layers and the plurality of vias are formed within the plurality of ILDs.

23. The semiconductor device of claim 22, wherein the electrical component further comprises one or more of the plurality of ILDs.

24. The semiconductor device of claim 1, wherein the substrate-film does not comprise any alumina.

25. The semiconductor device of claim 1, wherein the substrate-film covers an upper surface of the alumina ceramic substrate.

* * * * *